United States Patent
Volkov et al.

(10) Patent No.: US 11,910,337 B2
(45) Date of Patent: Feb. 20, 2024

(54) SYNCHRONIZATION OF AUDIO STREAMS AND SAMPLING RATE FOR WIRELESS COMMUNICATION

(71) Applicant: Starkey Laboratories, Inc., Eden Prairie, MN (US)

(72) Inventors: Alex Volkov, Eden Prairie, MN (US); Baktash Boghrati, Eden Prairie, MN (US); Edward John Cunningham, Savage, MN (US); Mohammad Reza Movahedi, Minnetonka, MN (US); Jeffrey Paul Solum, Greenwood, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 382 days.

(21) Appl. No.: 17/443,310

(22) Filed: Jul. 23, 2021

(65) Prior Publication Data

US 2021/0410090 A1 Dec. 30, 2021

Related U.S. Application Data

(63) Continuation of application No. 15/248,287, filed on Aug. 26, 2016, now abandoned.

(Continued)

(51) Int. Cl.
*H04W 56/00* (2009.01)
*H04R 25/00* (2006.01)
(Continued)

(52) U.S. Cl.
CPC .......... *H04W 56/001* (2013.01); *H04L 47/30* (2013.01); *H04R 25/552* (2013.01);
(Continued)

(58) Field of Classification Search
CPC .. H04W 56/001; H04W 56/004; H04L 47/30; H04L 47/263; H04L 2012/5681;
(Continued)

(56) References Cited

U.S. PATENT DOCUMENTS 5,355,363 A 10/1994 Takahashi et al.
5,666,428 A 9/1997 Farinelli et al.
(Continued)

FOREIGN PATENT DOCUMENTS

| EP | 2355387 A1 | 8/2011 |
| EP | 2736274 A2 | 5/2014 |
| EP | 2897384 A2 | 7/2015 |

OTHER PUBLICATIONS

"U.S. Appl. No. 15/248,287, Advisory Action dated Jun. 20, 2019", 3 pgs.

(Continued)

*Primary Examiner* — Eric Myers
(74) *Attorney, Agent, or Firm* — Schwegman Lundberg & Woessner, P.A.

(57) ABSTRACT

Disclosed herein, among other things, are methods and apparatus for providing a time-stamp based controller for synchronization of sink or source sampling rate with external packet rate. A method for wireless communications includes receiving a transmission of a packet using a wireless transceiver of an electronic device, and using a processor of the electronic device to read a first value of a system timer and store the first value as an arrival time-stamp. The packet is decoded and processed by the processor, and sent to an output. When the processed packet is sent, a second value of the system timer is read, adjusted and stored as a departure time-stamp. The arrival time-stamp and the departure time-stamp are used to calculate an adjustment stimulus for a sample rate actuator of the electronic device. The (Continued)

sample rate actuator is configured to maintain synchronization of sampling rate with an external packet rate.

20 Claims, 12 Drawing Sheets

Related U.S. Application Data

(60) Provisional application No. 62/211,242, filed on Aug. 28, 2015, provisional application No. 62/211,245, filed on Aug. 28, 2015.

(51) Int. Cl.

| | | |
|---|---|---|
| *H04L 47/30* | (2022.01) | |
| *H03H 17/06* | (2006.01) | |
| *H03H 17/00* | (2006.01) | |
| *H04L 47/263* | (2022.01) | |
| *H04L 12/70* | (2013.01) | |

(52) U.S. Cl.
CPC ........ *H04R 25/554* (2013.01); *H04W 56/004* (2013.01); *G10H 2250/631* (2013.01); *H03H 17/0018* (2013.01); *H03H 17/0642* (2013.01); *H04L 47/263* (2013.01); *H04L 2012/5681* (2013.01); *H04R 2225/55* (2013.01)

(58) Field of Classification Search
CPC .......................... H04R 25/552; H04R 25/554; H04R 2225/55; G10H 2250/631; G10H 2240/325; G10H 1/0083; H03H 17/0018; H03H 17/0642
See application file for complete search history.

(56) References Cited

U.S. PATENT DOCUMENTS

| | | | |
|---|---|---|---|
| 5,776,797 | A | 7/1998 | Nicewarner, Jr. et al. |
| 7,339,503 | B1 | 3/2008 | Elenes |
| 7,414,550 | B1 | 8/2008 | Sudharsanan |
| 7,715,578 | B2 | 5/2010 | Zhu et al. |
| 8,405,532 | B1 | 3/2013 | Clark et al. |
| 2005/0099341 | A1 | 5/2005 | Zhang et al. |
| 2005/0282568 | A1 | 12/2005 | Keerthi |
| 2007/0086610 | A1 | 4/2007 | Niederdrank |
| 2008/0055123 | A1 | 3/2008 | Buys |
| 2010/0202642 | A1 | 8/2010 | LoPresti et al. |
| 2010/0208905 | A1 | 8/2010 | Franck et al. |
| 2012/0308061 | A1 | 12/2012 | Zhu et al. |
| 2013/0123919 | A1 | 5/2013 | Goldstein et al. |
| 2013/0243203 | A1* | 9/2013 | Franck ............... H04S 3/008 381/17 |
| 2014/0321685 | A1 | 10/2014 | Rabel |
| 2015/0071281 | A1 | 3/2015 | Shiotani |
| 2015/0161145 | A1 | 6/2015 | Butters |
| 2015/0289065 | A1 | 10/2015 | Jensen et al. |
| 2017/0064651 | A1 | 3/2017 | Volkov et al. |

OTHER PUBLICATIONS

"U.S. Appl. No. 15/248,287, Advisory Action dated Jun. 23, 2020", 3 pgs.

"U.S. Appl. No. 15/248,287, Advisory Action dated Jul. 2, 2021", 3 pgs.

"U.S. Appl. No. 15/248,287, Final Office Action dated Mar. 18, 2020", 18 pgs.

"U.S. Appl. No. 15/248,287, Final Office Action dated Apr. 9, 2019", 16 pgs.

"U.S. Appl. No. 15/248,287, Final Office Action dated Apr. 23, 2021", 20 pgs.

"U.S. Appl. No. 15/248,287, Non Final Office Action dated Jul. 26, 2018", 17 pgs.

"U.S. Appl. No. 15/248,287, Non Final Office Action dated Sep. 3, 2019", 17 pgs.

"U.S. Appl. No. 15/248,287, Non Final Office Action dated Sep. 16, 2020", 18 pgs.

"U.S. Appl. No. 15/248,287, Response filed May 18, 2020 to Final Office Action dated Mar. 18, 2020", 9 pgs.

"U.S. Appl. No. 15/248,287, Response filed Jun. 10, 2019 to Final Office Action dated Apr. 9, 2019", 9 pgs.

"U.S. Appl. No. 15/248,287, Response filed Jun. 23, 2021 to Final Office Action dated Apr. 23, 2021", 10 pgs.

"U.S. Appl. No. 15/248,287, Response filed Oct. 23, 2018 to Non Final Office Action dated Jul. 26, 2018", 8 pgs.

"U.S. Appl. No. 15/248,287, Response filed Dec. 3, 2019 to Non Final Office Action dated Sep. 3, 2019", 8 pgs.

"U.S. Appl. No. 15/248,287, Response filed Dec. 16, 2020 to Non Final Office Action dated Sep. 16, 2020", 9 pgs.

"European Application Serial No. 16186053.1, Communication Pursuant to Article 94(3) EPC dated Jun. 21, 2018", 9 pgs.

"European Application Serial No. 16186053.1, Extended European Search Report dated Feb. 6, 2017", 13 pgs.

Akester, R, et al., "A new audio skew detection and correction algorithm", Proceedings/2002 IEEE International conference on multimedia and expo, (Aug. 2002), 261-264.

Blok, Marek, et al., "Fractional delay filter design for sample rate conversion", Computer Science and information systems (FEDCSIS) 2012 Federated conference on IEEE, (Sep. 9, 2012), 701-706.

Kleider, John, et al., "On the Performance of Variable Fractional Delay Arbitrary Sample Rate Conversion for Digital Signals", 2014 IEEE Military Communications Conference, (Oct. 6, 2014), 724-730.

\* cited by examiner

ND AUMPLING OF AUDIO STREAMS
AND SAMPLING RATE FOR WIRELESS
COMMUNICATION

CLAIM OF PRIORITY AND INCORPORATION
BY REFERENCE

The present application is a continuation of U.S. patent application Ser. No. 15/248,287, filed Aug. 26, 2016, which claims the benefit under 35 U.S.C. § 119(e) of U.S. Provisional Patent Application No. 62/211,242, filed Aug. 28, 2015, and of U.S. Provisional Patent Application No. 62/211,245, filed Aug. 28, 2015, the disclosures of which are hereby incorporated by reference herein in their entirety.

FIELD OF THE INVENTION

The present subject matter relates generally to wireless communication, and in particular to synchronization for audio streaming of wireless communication.

BACKGROUND

Wireless communication is used for a variety of applications, including for use with hearing assistance devices. Modern hearing assistance devices typically include digital electronics to enhance the wearer's experience. In the specific case of hearing aids, current designs employ digital signal processors rich in features. Their functionality is further benefited from communications, either from a remote source or from ear-to-ear for advanced processing. Thus, it is desirable to include wireless functionality for a hearing aid to allow for functions such as ear to ear synchronization, remote control, programming and configuration, streaming audio, bi-directional audio, etc. The present subject matter can be used for any wireless communication system, including but not limited to hearing assistance device applications.

SUMMARY

Disclosed herein, among other things, are methods and apparatus for providing a time-stamp based controller for synchronization of sink or source sampling rate with external packet rate. A method for wireless communications includes receiving a transmission of a packet using a wireless transceiver of an electronic device, and using a processor of the electronic device to read a first value of a system timer and store the first value as an arrival time-stamp. The packet is decoded and processed by the processor, and sent to an output. When the processed packet is sent, a second value of the system timer is read, adjusted and stored as a departure time-stamp. The arrival time-stamp and the departure time-stamp are used to calculate an adjustment stimulus for a sample rate actuator of the electronic device. The sample rate actuator is configured to maintain synchronization of sampling rate with an external packet rate.

Disclosed herein, among other things, are methods and apparatus for providing synchronization of incoming and outgoing audio streams in bidirectional fractional delay (FD) sampling rate converter (SRC). A method for bidirectional wireless communications includes receiving a transmission of a packet using a wireless transceiver of an electronic device, and calculating an incoming fractional delay (FD) using a FD sampling rate converter (SRC), where the FD SRC configured to synchronize sample rate of the device with an external packet rate. In various embodiments, the incoming FD and current phase increment value of the FD SRC are used to calculate an outgoing FD, to provide a one-to-one relation between incoming and outgoing packets for the device.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

Figure 1:
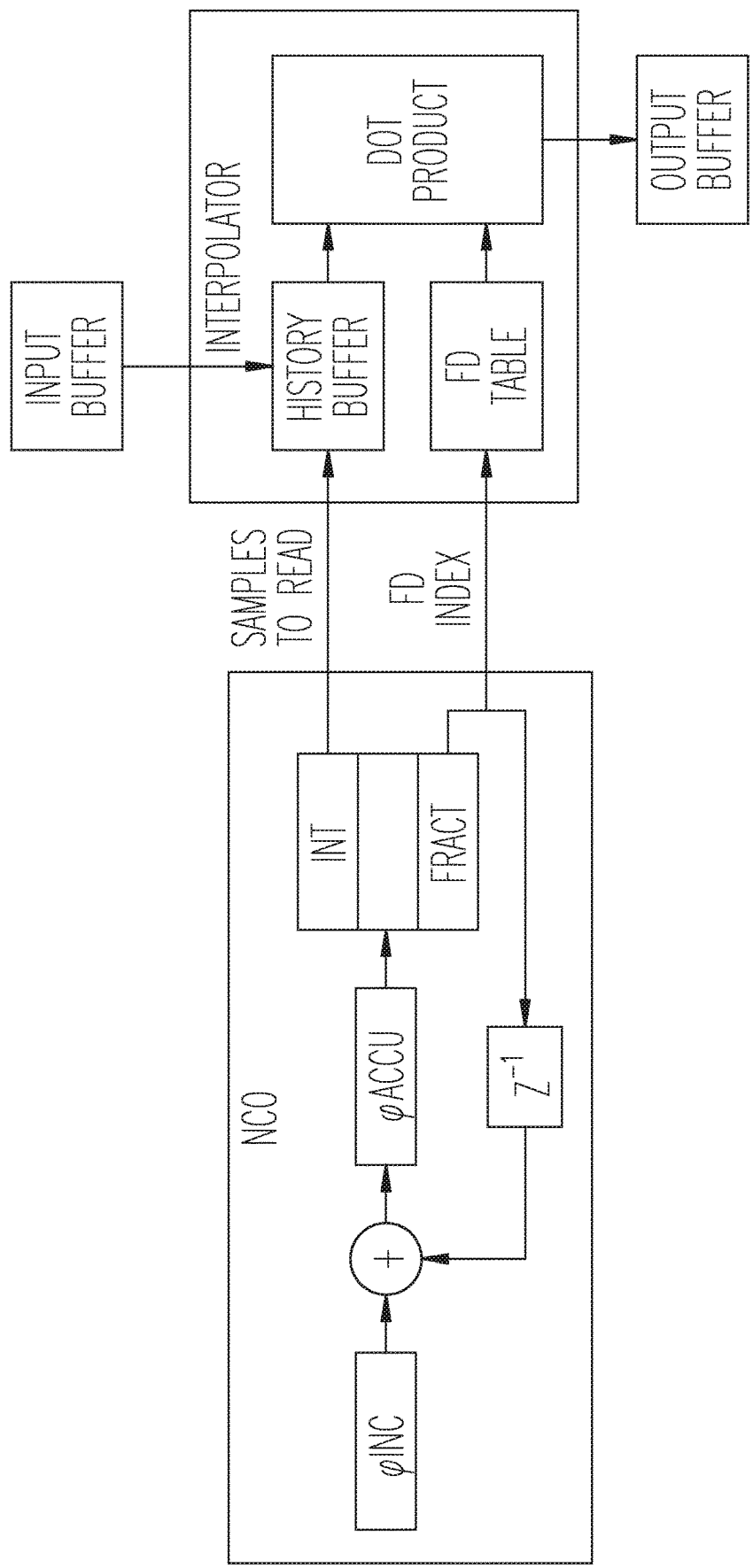
FIG. 1 illustrates a block diagram of a fractional delay sampling rate converter (FD SRC), according to various embodiments of the present subject matter.

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

Modern portable wireless communication equipment employs radio communications for various uses, some of which include the transmission of data such as audio and video data. Such communication utilizes highly reliable data networks capable of low packet and bit error rates. A wireless host can be the source of the audio or video information. Portable electronic devices such as headsets, hearing aids, head worn displays and the like can send and receive wireless communication.

The present detailed description will discuss hearing assistance devices using the example of hearing aids. Hearing aids are only one type of hearing assistance device. Other hearing assistance devices include, but are not limited to, those in this document. It is understood that their use in the description is intended to demonstrate the present subject matter, but not in a limited or exclusive or exhaustive sense.

Terminology

Total Throughput Delay of an audio streaming system—the time from when a reference signal is input into the system (i.e. a source device such as a hearing aid or accessory) to when the reference signal leaves the system (i.e. the sink device such as a hearing aid's speaker).

Device Delay (Latency) of audio stream—the tune it takes for a reference signal to travel into the device (e.g. through source's microphone) and then out of the device (e.g. through sink's receiver).

Source is a device, which generates (creates) an audio stream.

Sink is a device, which consumes an audio stream.

Relay is a device, which passes through an audio stream.

Source/Sink is a combination of Source and Sink in one device, which consumes one audio stream and creates another one.

Sampling Rate Actuator—software module or software-controlled hardware unit, which allows control of the effective audio sampling rate of the device.

Sampling Rate Converter (SA)—software module that performs sampling rate conversion of an audio stream to obtain a new discrete representation of the underlying continuous signal of the audio stream. There are two groups of SRC depending on the algorithm and implementation:
- SRC which utilizes the ratio of new sampling rate to old sampling rate (conversion ratio) is fixed and equal to a rational number L/M
- SRC with arbitrary conversion ratio based on restoration of the underlying continuous signal at new sampling points using windowed sync function or interpolation using Lagrange interpolator, spline interpolator, etc.

Fractional Delay SRC (FD SRC)—type of SRC with arbitrary conversion ratio shown in FIG. 1, which illustrates a block diagram of a fractional delay sampling rate converter (FD SRC), according to various embodiments of the present subject matter. The conversion ratio of the FD SRC is defined by phase increment value $\varphi_{inc}$. The conversion ratio of FD SRC can be adjusted at any time by changing $\varphi_{inc}$ value. This allows the use of FD SRC as a sample rate actuator. Relative fractional delay FD is calculated as one of the intermediate results of FD SRC processing. It can be used to calculate timing position of the new sample on the underlying continuous signal, which is used for calculation of "departure timestamp" as it is discussed below.

Figure 8:
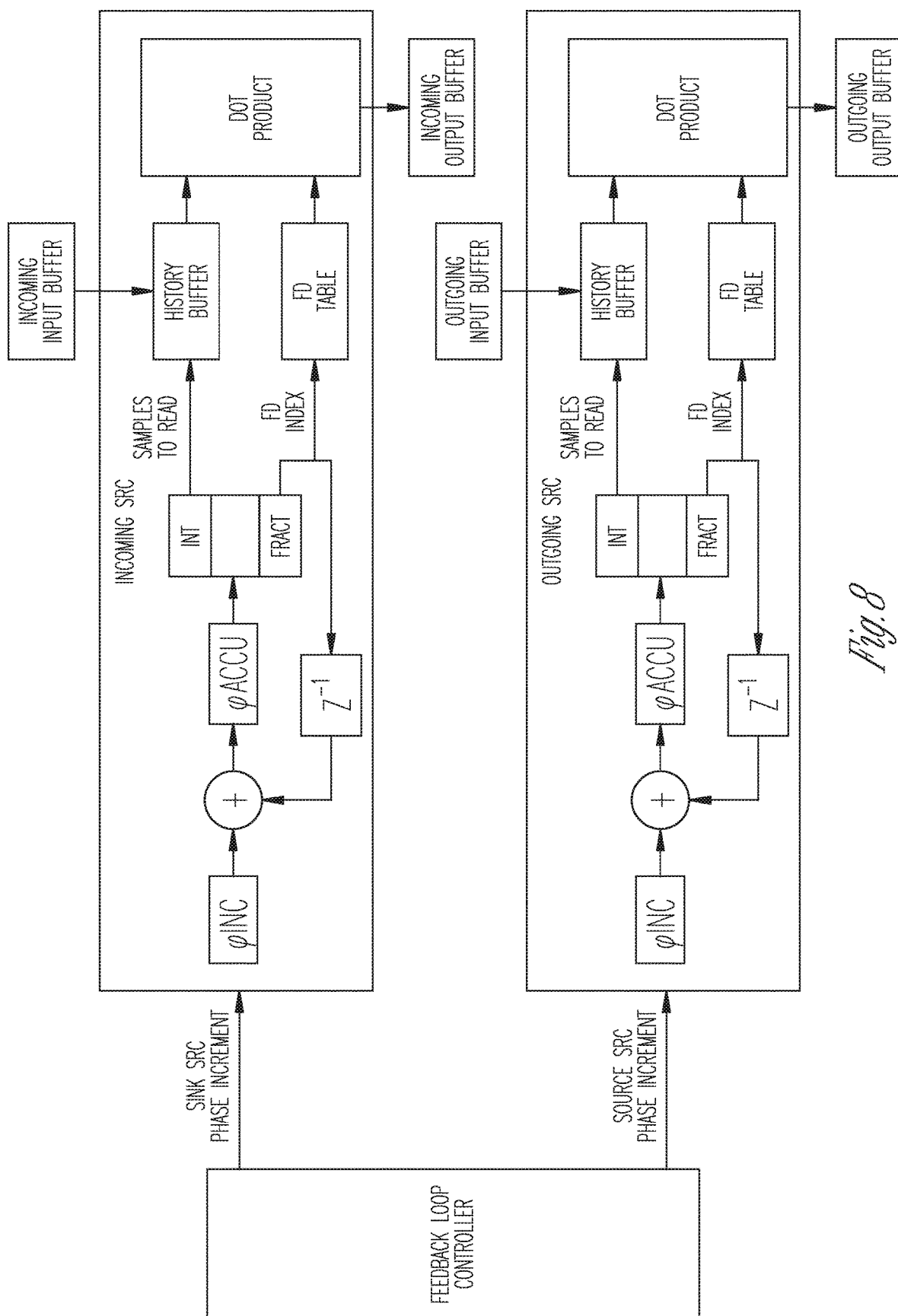
FIG. 8 illustrates a block diagram of a bidirectional FD SRC with independent incoming and outgoing channels, according to various embodiments of the present subject matter.

Bidirectional FD SRC (BiSRC)—sample rate converter with two channels: incoming channel and outgoing channel. Input sampling rate of the incoming channel is referred as incoming input sampling rate and input buffer of the incoming channel is referred as incoming input buffer. The incoming output, outgoing input and outgoing output buffers and sampling rates are defined in a similar way as shown in FIG. 8. Assuming that incoming input sampling rate is equal to outgoing output sampling rate and incoming output sampling rate is equal to outgoing input sampling rate, BiSRC can be designed to use less MIPS and have better synchronization than two independent SRCs.

Software Controlled System Clock Generator (SysClk)—software-controlled hardware unit, which allows control of the clock rate of the device including input output, such as an analog-to-digital converter (ADC) and a digital-to-analog converter (DAC).

Time Division Duplexing (TDD)—method of duplex communication where uplink is separated from downlink by the allocation of different time slots in the same frequency band.

The present subject matter can be used for implementation of such features as a television (TV) streamer or for cellular phone/entertainment device (CPED) audio streaming, ear-to-ear streaming and CROS/BiCROS (Contra Lateral Routing of Signal (CROS) is a hearing aid technology for people with unilateral hearing), and uses of synchronization of audio input or output sampling rate with external packet rate. As described herein, a unified all-purpose solution has been developed.

In the development of audio streaming systems, it is often desirable to synchronize the sampling rate of an audio source and sink. In one example, source sampling rate is slightly higher than sink sampling rate. In that case, the audio samples will be accumulated in the sink buffer faster than samples are consumed from it. Eventually, this will result in overflow of the sink buffer and result in artifacts in the audio stream. It should be noted that, with accumulation of samples in the sink buffer, device delay of the sink increases as each samples "spends" more time in the sink buffer. Device delay will remain the same only in the case where the sampling frequencies of the source and the sink are perfectly identical.

The present subject matter measures the device delay and maintains it constant by adjusting the effective sampling rate of the device. To measure the device delay, time-stamps of the moments when samples enter and leave the device are measured and in some instances calculated. Thus two time-stamps, one of the sample's entry moment and one of the sample's leave moment are input as data to the feedback loop controller. Its output data is a control signal which adjusts the effective sampling rate of the device, as shown in the FIGS. 2-7 below. The present subject matter provides great flexibility and can be used with many different devices (source, sink, relay or combined) with different internal architectures. For example, it is applicable to devices where the packet reception and processing of audio samples are carried out by different central processing unit (CPU) cores. In one example device, a processing chip contains two CPU cores: CM3 and CFX. Reception of streaming radio packets is performed by CM3 firmware and therefore all packet timing is originally available for CM3. CFX firmware includes a Sample Rate Converter (SRC), which is used to adjust the effective sampling rate. The re-sampled audio stream is then sent to the output DAC.

For all audio streaming systems:
1. Synchronization of the sampling rate with an external packet rate is used to prevent overflow or underflow of a buffer of audio samples.

2. The synchronization is implemented in such a way to avoid discontinuities of the audio signal and any other audible artifacts and distortions.

The synchronization is particularly important for binaural system having two sinks clocked by different system clocks generators:

3. The synchronization maintains total throughput delay equal on both sinks, thus preventing "image shift" effects for the stereo pair, i.e. change of the perceived spatial location of individual sound sources.
4. The synchronization prevents undesired psycho-acoustical effects such as apparent loudness of the channel with smaller total throughput delay, echo, and reverberation.

All of the above problems can be solved by maintaining synchronization and the device delay equal to a preconfigured value, using the present subject matter.

Previous solutions have been based on maintaining a number of samples in the audio stream buffer. When the number of samples grew above a predefined "watermark", the effective sampling rate (consumption rate) was increased and the level of buffered data went down. When the number of samples dropped below the watermark, the effective sampling rate was decreased and the level of buffered data went up.

It should be noted that changes in the level of buffering is another manifestation of change of audio stream delay. From this point of view, maintaining a constant level of buffering is a way to maintain a constant device delay time. The main disadvantage of the previous solution is its low accuracy. To determine when the consumption rate needed to be adjusted, the number of buffer samples had to be at least one sample above or below watermark, i.e. variation of device group delay had to be more or equal than one sampling period. For example, for sampling rate 16 kHz variations of the device group delay would be >62 µsec. Such accuracy was not sufficient to prevent all audio artifacts listed above, e.g. "image shift" effect for binaural system.

The main difference of the present subject matter is that it has the ability to measure the device delay and maintain it equal to a preconfigured value much more accurately. The present subject matter maintains variations of device delay of an audio stream constant close to its preconfigured value with accuracy (absolute value and variations) better than 10 microseconds, in an embodiment.

Figure 2:
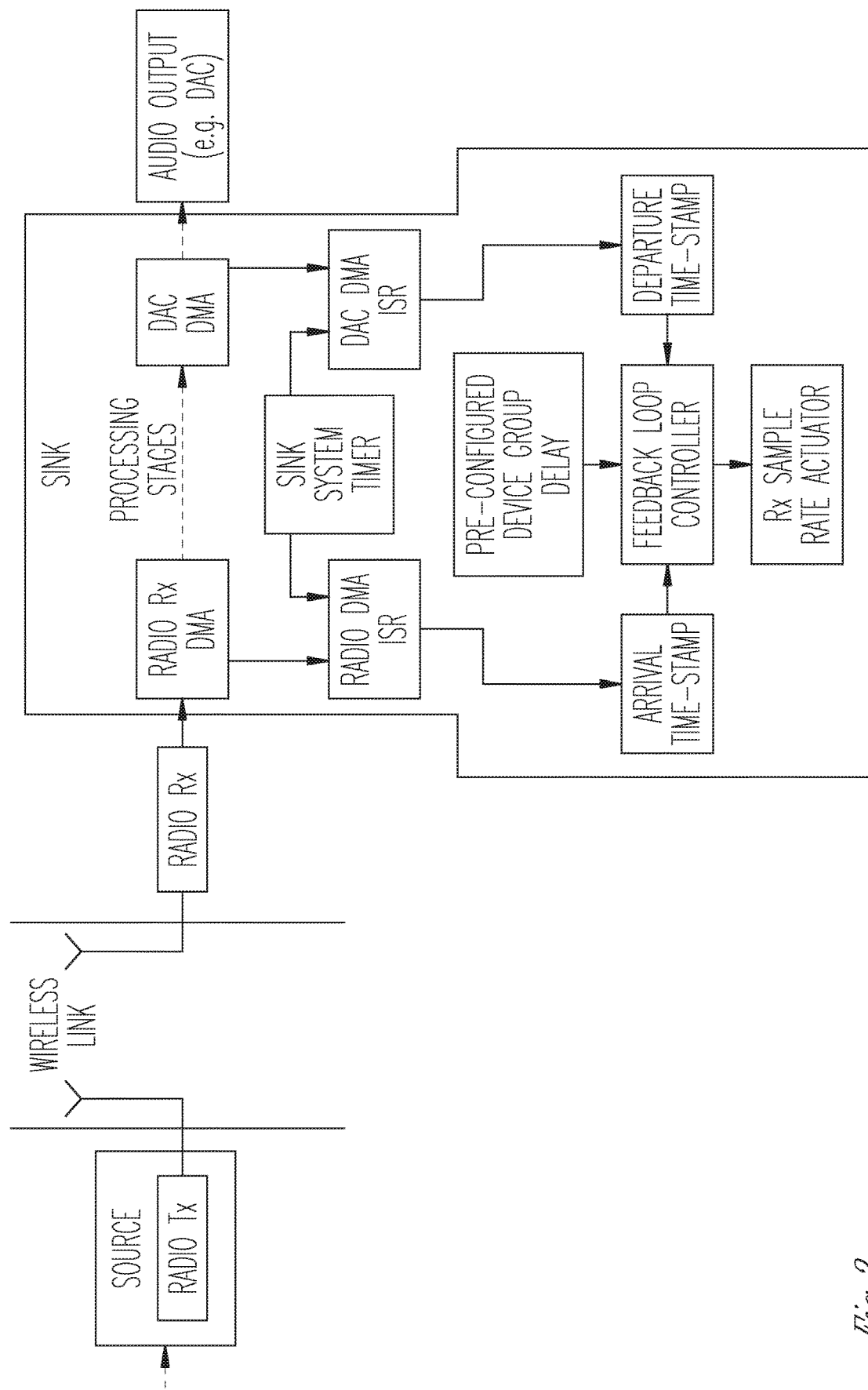
FIG. 2 illustrates a block diagram for sink sample rate synchronization, according to various embodiments of the present subject matter.

FIG. 2 illustrates a block diagram for sink sample rate synchronization, according to various embodiments of the present subject matter. This present subject matter provides for sample rate synchronization of the sink, in various embodiments, as illustrated in FIG. 2. Applications for other elements of the audio streaming system (source, relay, etc.) are discussed below.

In a typical wireless system, samples are transmitted over the communication channel in packets. It is assumed that the moment of start (or end) of packet reception can be time-stamped with high accuracy by reading a timer value from the associated firmware code, e.g. interrupt service routine (ISR) of the direct memory access (DMA) channel between CPU and radio chip. On the diagram shown in FIG. 2, a received packet is transferred from the Radio Rx subsystem to the system CPU through a DMA channel or equivalent buffer mechanism. Completion of the packet DMA transfer triggers a Radio DMA ISR. The radio DMA ISR reads the current value of the sink system timer and optionally processes it to reduce jitter and stores as an "arrival time-stamp", in various embodiments. For definiteness, it is assumed that this time-stamp is associated with the first audio sample in the packet. Packet audio samples are then decoded and processed by the audio processing system shown in FIG. 2 as "processing stages". The processed samples of the audio stream are transferred to the output, e.g. DAC. The moment of the output of the first sample of the packet is time-stamped. The exact method of time-stamping of the first sample depends on the implementation of the audio stream output. In the example from FIG. 2, the output from the CPU to DAC is handled by DMA channel 2. Completion of the DMA transfer triggers DMA2 ISR. DMA2 ISR reads current value of the sink system timer then, if necessary, performs adjustment of the timer value as discussed below and stores it as a "departure time-stamp". The arrival and departure time-stamps are used as input data for the feedback loop controller. In various embodiments, the controller calculates an error signal using the following formula:

Error=(DepartureTimeStamp−ArrivalTimeStamp)−PreConfiguredGroupDelay

In various embodiments, the error value is then used to calculate an adjustment stimulus for the sample rate actuator using one of algorithms discussed in process control theory, e.g. a proportional-integral-derivative (PID) controller algorithm.

Calculation of Departure Timestamp

Figure 3:
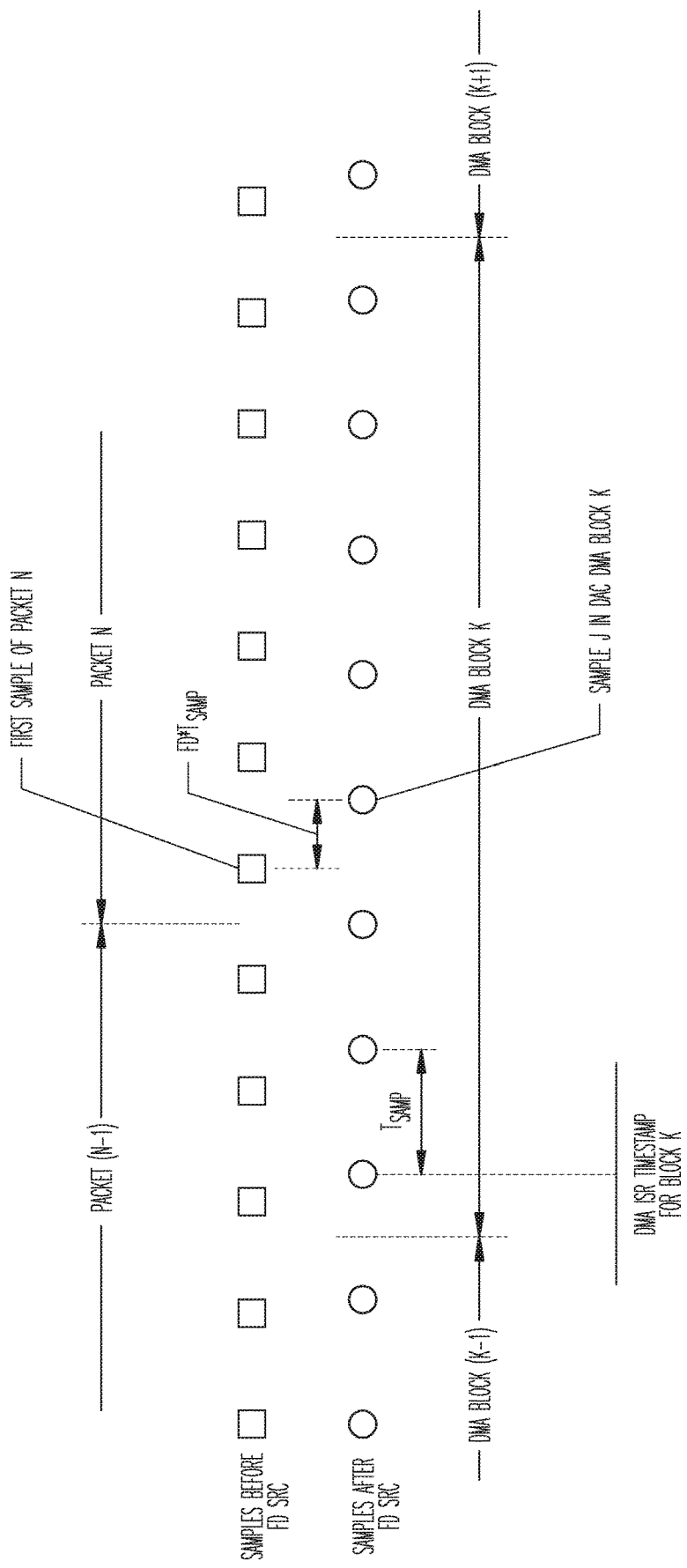
FIG. 3 illustrates a timing diagram for calculation of departure timestamp, according to various embodiments of the present subject matter.

In some circumstances, accurate measuring of the departure time requires additional calculations. Examples include multi-sample block DAC DMA transfer and using FD SRC as a sample rate actuator. FIG. 3 illustrates a combination of both. The upper row shown in FIG. 3 represents samples before FD SRC. Arrival timestamp of the first sample of packet n has been recorded at Radio DMA ISR as described in FIG. 3. The lower row represents samples after FD SRC. These samples are transferred to DAC by DAC DMA 8 samples per block. The timestamp of a first sample of block k is recorded by DAC DMA ISR for block k. In case of multi-sample DAC DMA transfer, DAC DMA ISR is triggered at the completion of block transfer. The value of timer read by ISR corresponds to the first sample of the DMA block. If "j" is index of the output sample in the DAC DMA block, FD is fractional delay used to calculate output sample j and $T_{samp}$ is sampling period in time-stamp units, departure time-stamp of the first sample of the packet n is calculated as:

DepartureTimeStamp=DacDmaIsrTimeStamp+$j \cdot T_{samp}$−FD·$T_{samp}$

Simple Example of Calculation of Sample Rate Adjustment Stimulus for FD SRC

A number of complex and sophisticated algorithms offered by the process control theory can be used to provide fast convergence, minimize variations and maintain stability of the device group delay. The following formula is a simple example of such a calculation, which provides the required quality.

$$\varphi_{inc} = \left( \frac{\frac{TA_i - TA_{i-1}}{N_{samp}}}{T_{samp}} \right)^{-1} = T_{samp} \cdot \left( \frac{TA_i - TA_{i-1}}{N_{samp}} \right)^{-1}$$

where
$\varphi_{inc}$—Phase increment of FD SRC
$TA_i$—Arrival timestamp of i-th packet
$N_{samp}$—Number of samples per packet
$T_{samp}$—Sampling period in timestamp units Limited accuracy of arrival timestamp, jitter, rounding errors and other factors can lead to drift and variations of the device group delay. In order to lock device group delay to the preconfigured value, one more term has to be added to the above formula:

$$\varphi_{inc} = T_{samp} \cdot \left( \frac{TA_i - TA_{i-1}}{N_{samp}} + \alpha \cdot \text{Error} \right)^{-1}$$

where
Error—Error signal calculated by the feedback loop controller (see above
α—Error gain
As mentioned above, the phase increment can be used as an interface to FD SRC to control the sampling rate conversion ratio.

Optimization of System Total Throughput Delay

In order to minimize system total throughput delay, the preconfigured value for the device group delay should be minimal, but sufficient to accommodate the longest branch of the signal processing scheme. If the signal processing scheme changes (e.g. different type of codec has been selected or packet loss concealment mechanism has been enabled or disabled), this value can be reconfigured to optimize system total throughput delay.

Various embodiments create an artificial intelligence (AI) system, which can track processing time over the different branches of the processing scheme and automatically reconfigure the value of the device group delay in order to minimize total system throughput delay. In this case, if such a receiver is used in a binaural system, a preconfigured value of device group delay time must be synchronized between receivers of the left and right channels.

Additional Embodiments

Source

Figure 4:
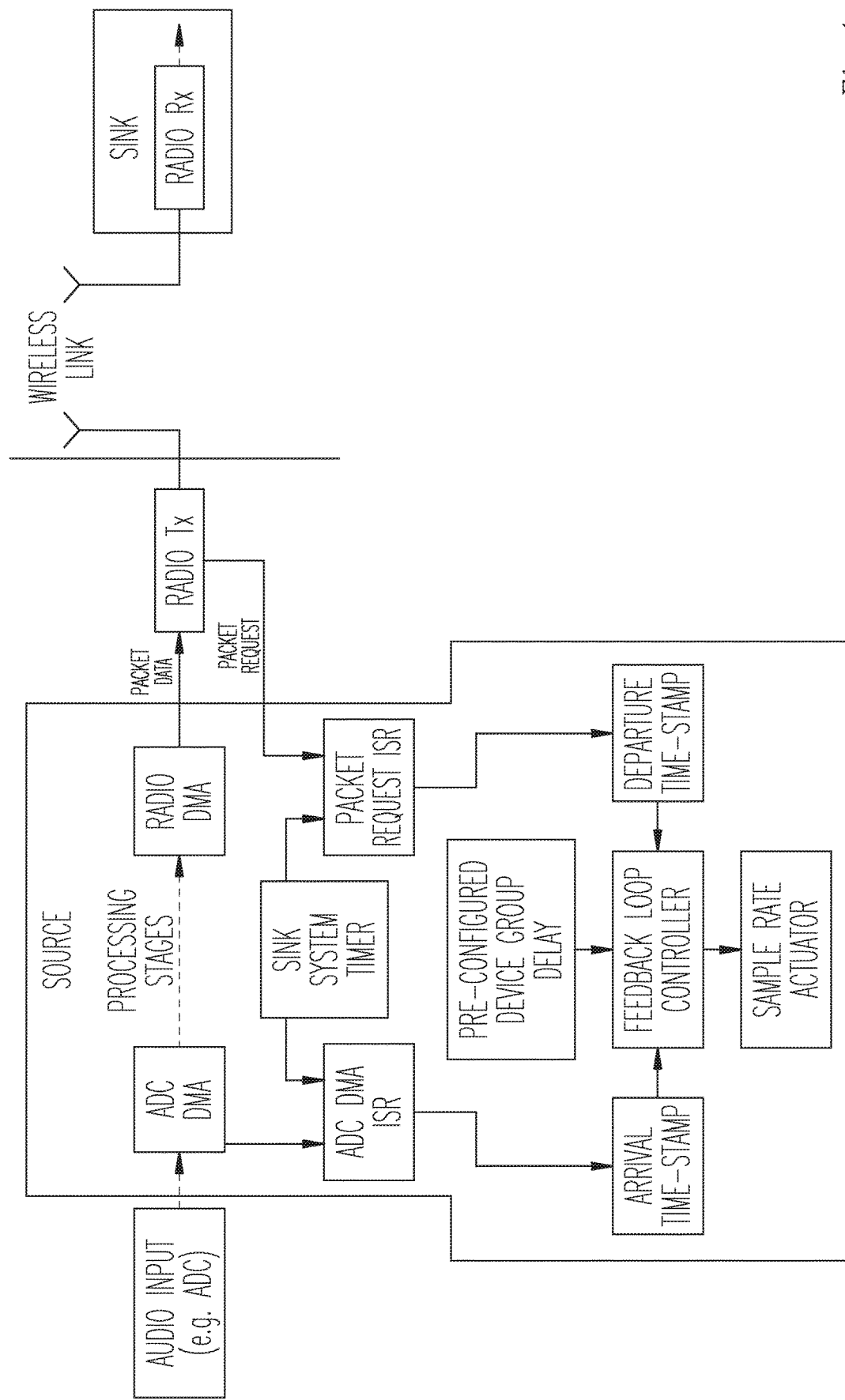
FIG. 4 illustrates a block diagram for synchronization of the sampling rate of a source device, according to various embodiments of the present subject matter.

FIG. 4 illustrates a block diagram for synchronization of the sampling rate of a source device, according to various embodiments of the present subject matter. A scenario for synchronization of the sampling rate of the source device is shown in FIG. 4. In this scenario, the packet rate is driven by an external device (packet requests from Radio Tx as shown in FIG. 4) where the audio sampling rate is derived from a local oscillator. The source sampling rate synchronization is mirror symmetric to the synchronization of the sink scenario as shown in FIG. 2.

The following formula can be used to calculate the feedback stimulus in case of using FD SRC as a sampling rate actuator:

$$\varphi_{inc} = T_{samp}^{-1} \cdot \left( \frac{TD_i - TD_{i-1}}{N_{samp}} + \alpha \cdot \text{Error} \right)$$

Source/Sink

Figure 5:
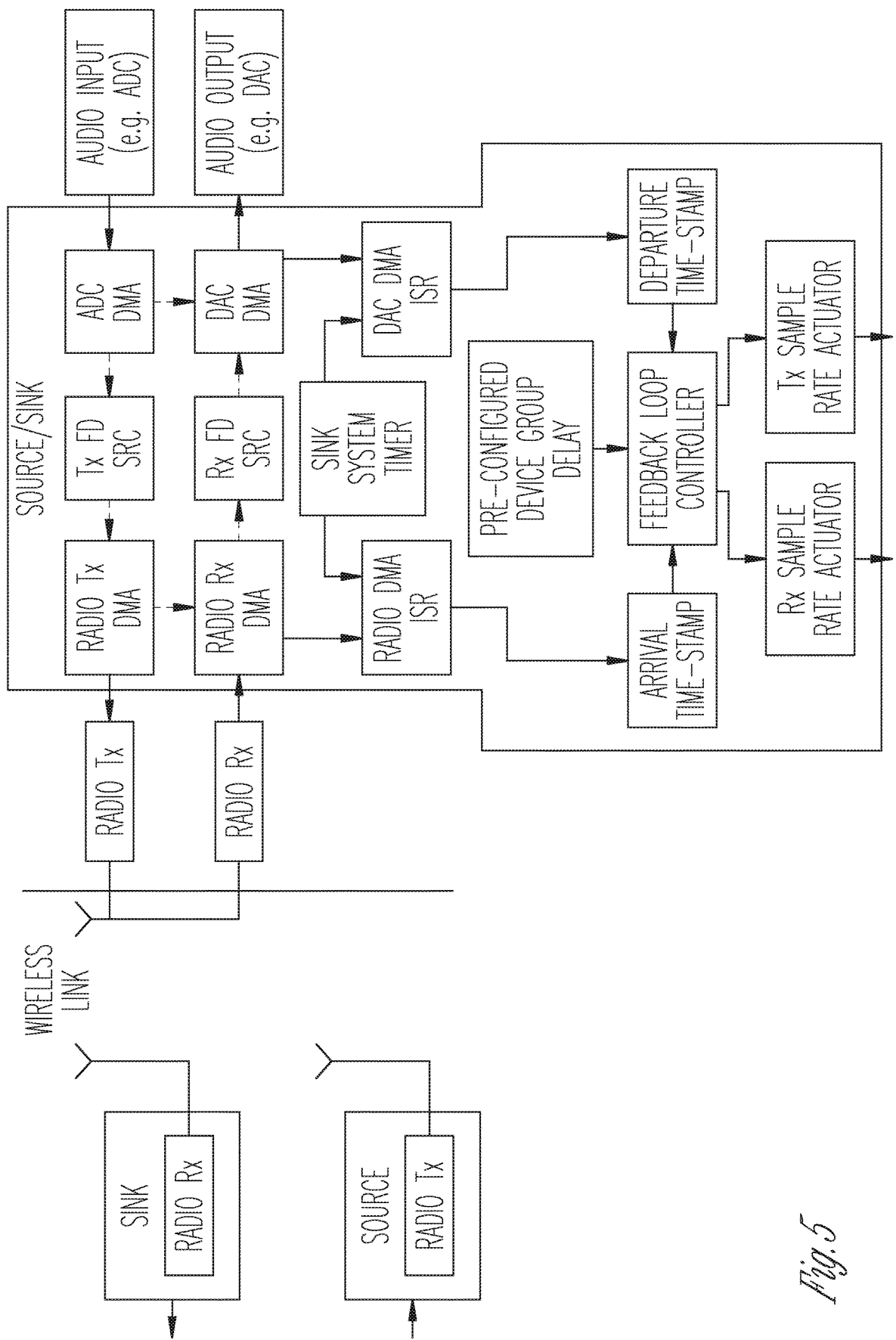
FIG. 5 illustrates a block diagram of synchronization of the sampling rate of source and sink devices, according to various embodiments of the present subject matter.

The following example assumes that transmission and reception over the wireless link are performed alternately. This means that external packet rates for reception and transmission are in sync. Thus either transmission or reception external packet rate can be used for sampling rate synchronization (in FIG. 4 Rx packet rate is used). It is also assumed that clocks for audio output and audio input are derived from the same oscillator and are also synchronized. FIG. 5 illustrates a block diagram of synchronization of the sampling rate of source and sink devices, according to various embodiments of the present subject matter.

Since SysClk equally affects the source and sink sampling rate, only one adjustment stimulus needs to be calculated by the feedback loop controller in case where SysClk is used as a sample rate actuator. In the case where FD SRC is used as an actuator, two phase increment values need to be calculated: for sink and source FD SRC instances (Rx FD SRC and Tx FD SRC in FIG. 5). Calculation of phase increment is done by using formulas provided above for Sink and Source devices.

Relay

Figure 6:
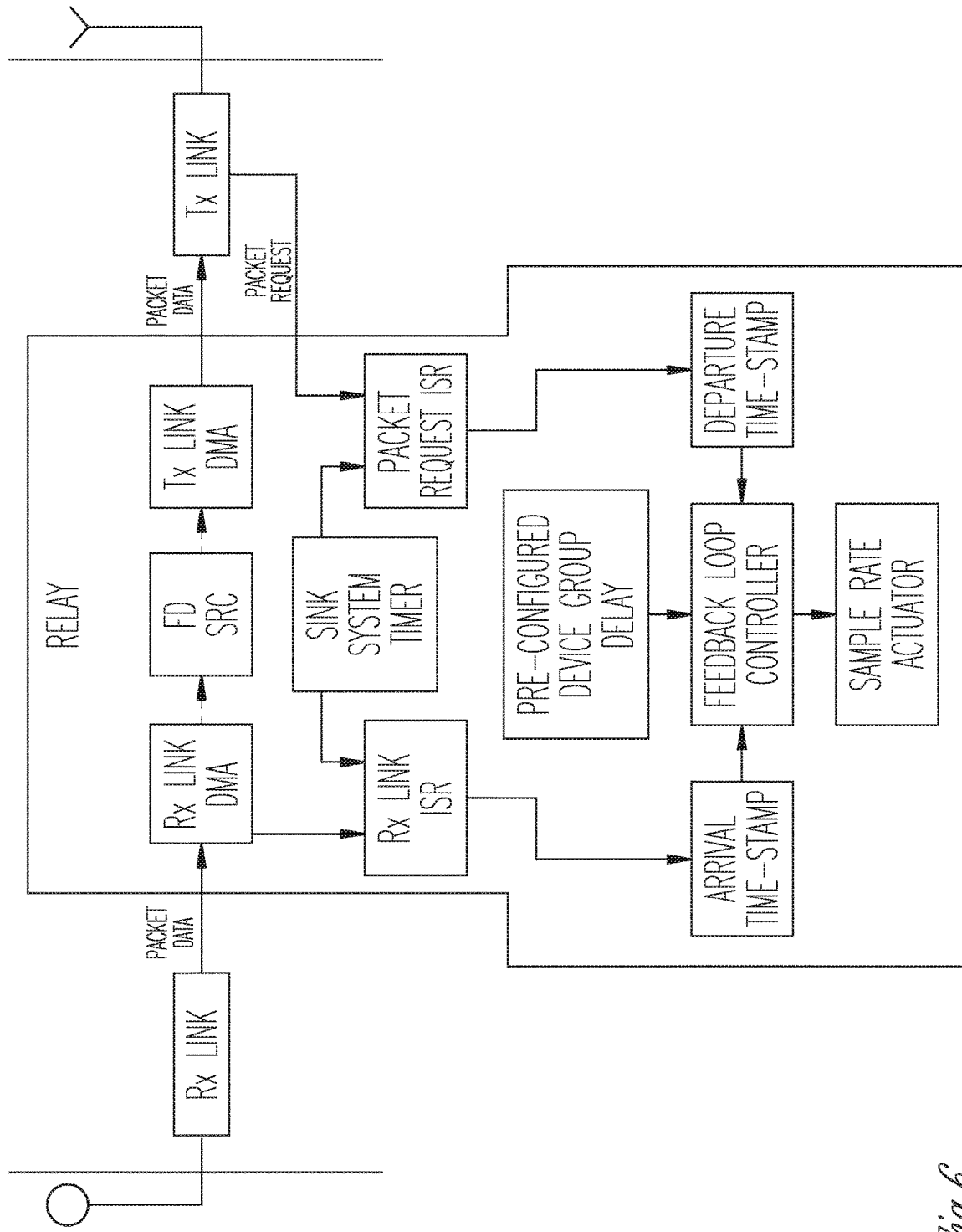
FIG. 6 illustrates a block diagram of synchronization of the sampling rate of a relay device, according to various embodiments of the present subject matter.

The relay device forwards packets received from the input wireless link (Rx Link in FIG. 5) to the output wireless link (Tx Link in FIG. 5). In the case where packet rates of Rx Link and Tx Link are synchronized (e.g. TDMA channel with Rx and Tx time slots), no sample rate synchronization is needed. In case where Rx Link and Tx Link are asynchronous, their synchronization can be realized on the relay device by synchronization of the sampling rate. FIG. 6 illustrates a block diagram of synchronization of the sampling rate of a relay device, according to various embodiments of the present subject matter. Since the relay does not use an input/output device, the sampling rate of which can be adjusted by software, SysClk cannot be used as a sampling rate actuator. In FIG. 6, FD SRC is used as a sample rate actuator.

FD SRC Actuator of the Present Subject Matter Versus SysClk Actuator

Figure 7:
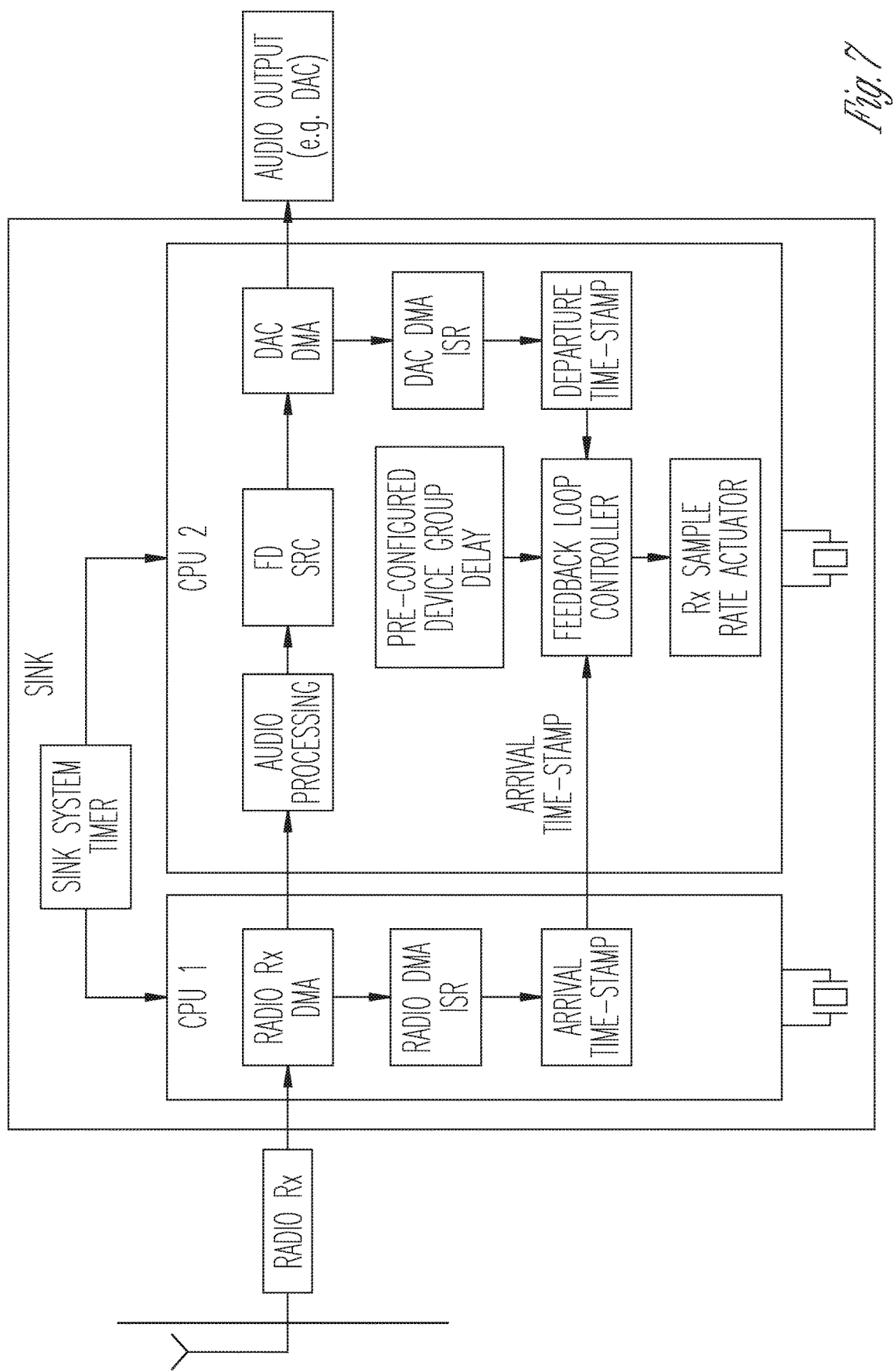
FIG. 7 illustrates a block diagram of synchronization of the sampling rate of a device with multiple processors, according to various embodiments of the present subject matter.

Each of actuators has its advantages and disadvantages.
Advantages of the SysClk based sampling rate actuator:
  Consumes less CPU resources such as MIPS and memory
  Does not introduce distortion caused by signal interpolation
Advantages of FD SRC based sampling rate actuator:
  Does not use programmable hardware, which controls sampling rate of input/output devices (e.g. SysClk).
  Can be used for sample rate synchronization of several asynchronous audio streams running in parallel.
  Can perform conversion of the sampling rate in addition to the sampling rate synchronization if the sampling rates of source and sink differ. For example, FD SRC can perform conversion of audio stream sampling rate in addition to the sampling rate synchronization
  Can synchronize audio stream in relay devices (see above)
  FD SRC operation in not affected by switching the CPU clock rate to reduce power consumption
  Can be applied to a device with multiple CPUs including the case where CPUs are clocked by different asynchronous oscillators (as shown in FIG. 7) as long as they have access to the system timer.
  When using FD SRC as a sample rate actuator, the CPU clock rate does not have to be adjusted and thus, devices whose operation depends on CPU clock rate are not disrupted (e.g. UART).
  Provides linear and typically more accurate control of the sampling rate, has zero response time and ultimately provides more accurate maintenance of the device group delay.

In general, usage of FD SRC as an actuator is more versatile and in many cases provides more accurate synchronization of the audio stream sampling rate. Its disadvantage is relatively high MIPS and memory consumption, so for devices with low MIPS budget using SysClk as a sample rate actuator may be a better option. Advantages of the present subject matter include elimination of sound distortions caused by buffer underfloor or overflow, and elimination of stereo image shift in binaural audio streaming systems.

Synchronization of Incoming and Outgoing Audio Streams for Bidirectional FD SRC In various embodiments, bidirectional audio streaming is used to support phone calls via hearing aid devices linked with a Cell Phone/Entertainment Device (CPED). Two-way communication between the hearing aid devices and the CPED is performed using TDD with two time slots as show in FIG. 9. When using a TDD channel, the number of incoming and outgoing audio samples over packet period is locked.

When using TDD communication channel, incoming and outgoing audio streams are synchronized in order to avoid buffers overflow or underflow as well as noticeable audio artifacts. The present subject matter firmly synchronizes the number of incoming and outgoing samples per packet period without distorting quality of the audio stream.

The method described herein is applicable to a system where a FD SRC is used for synchronization of the device sample rate with external packet rate. The idea of the method is to generate one outgoing sample for each consumed incoming sample. As it is shown in FIG. 1, to generate a new sample by the FD SRC interpolator the following parameters are used:
1. Number of samples to read from the input buffer to the interpolator history buffer.
2. Fractional delay index, which defines coefficient vector from the FD vector table to be used for interpolation.

The present subject matter calculates those parameters for outgoing samples from parameters calculated for incoming samples. One-to-one relation between incoming and outgoing samples automatically guarantees exact equality of the number of incoming and outgoing samples.

A block diagram of a previous implementation of a device with bidirectional audio streaming is shown in FIG. 5. The device is of sink/source type, and the consumed (sink) audio stream is "incoming" and generated (source) audio stream is "outgoing". This previous implementation contains two FD SRC converters: one for synchronization of sample rate of the incoming audio stream and one for synchronization of sample rate of the outgoing audio stream. Since incoming FD SRC converts the external sample rate to the internal sample rate and outgoing FD SRC converts the same internal sample rate to the same external sample rate, their phase increment parameters are related as shown in the following simple relation:

$$\text{source}\_\varphi_{inc} = \text{sink}\_\varphi_{inc}^{-1}$$

The value of $\text{sink}\_\varphi_{inc}$ is calculated and then $\text{source}\_\varphi_{inc}$ is calculated as a reciprocal. The problem is that in this case only the formula for $\text{source}\_\varphi_{inc}$ contains the feedback term and the formula for $\text{source}\_\varphi_{inc}$ does not. As a result device latency for the outgoing audio stream will vary (e.g. due to limited accuracy of computations) and such variation will not be compensated.

Figure 9:
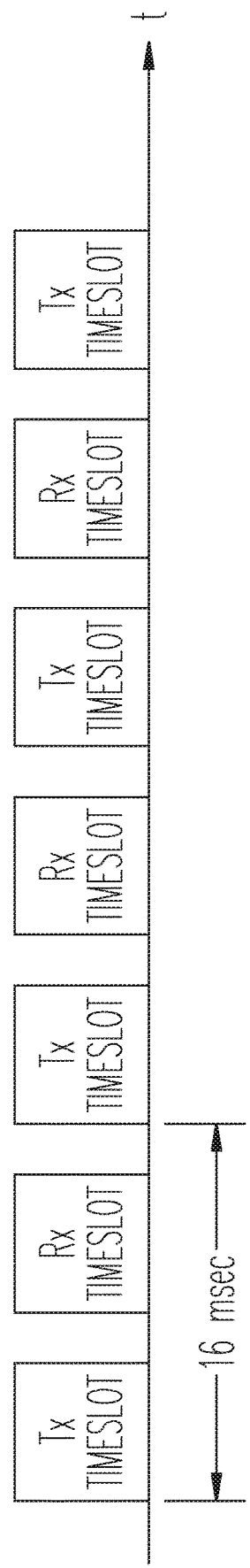
FIG. 9 illustrates a timing diagram of bidirectional audio streaming, according to various embodiments of the present subject matter.

FIG. 8 illustrates a block diagram of a bidirectional FD SRC with independent incoming and outgoing channels, according to various embodiments of the present subject matter. Bidirectional audio streaming is performed via TDD channel with two timeslots: for the incoming and outgoing audio streams packets as shown in FIG. 9. For stable operation of the device, the number of generated outgoing samples within one packet period is equal to the number of samples in the packet. Variation of the device audio latency for the outgoing stream may eventually result in underflow or overflow of the outgoing output buffer.

In previous solutions, the system clock rate of the sink device was selected so that the sampling rate of the sink was as close as possible to the sampling rate of the source but above it. For the incoming audio stream the number of samples received in one packet was equal or less than number of samples sent to the output in the packet period. If number of samples was less than required, zeros were inserted instead of missing samples. Typically, one zero sample was inserted after a few packets. For the outgoing audio stream the number of samples generated by the source in one packet period was equal to more than the number of samples. As a result, one of samples was occasionally discarded. Of course, inserting zeros and dropping "extra" samples resulted in audible distortions of the incoming and outgoing audio streams.

The present subject matter provides for outgoing FD SRC generating the same number of samples as is consumed by the incoming FD SRC. TDD external packet rate is the same for incoming and outgoing packets. If packet size is the same for the incoming and outgoing audio streams, input incoming and outgoing sample rates are also the same. We assume the sampling rate of input/output peripherals (e.g. ADC/DAC) are also the same. As is shown in FIG. 10, input incoming sample rate (blue squares) and outgoing output sample rate (orange squares) are the same; output incoming sample rate (blue circles) and input outgoing sample rate are equal.

Figure 10:
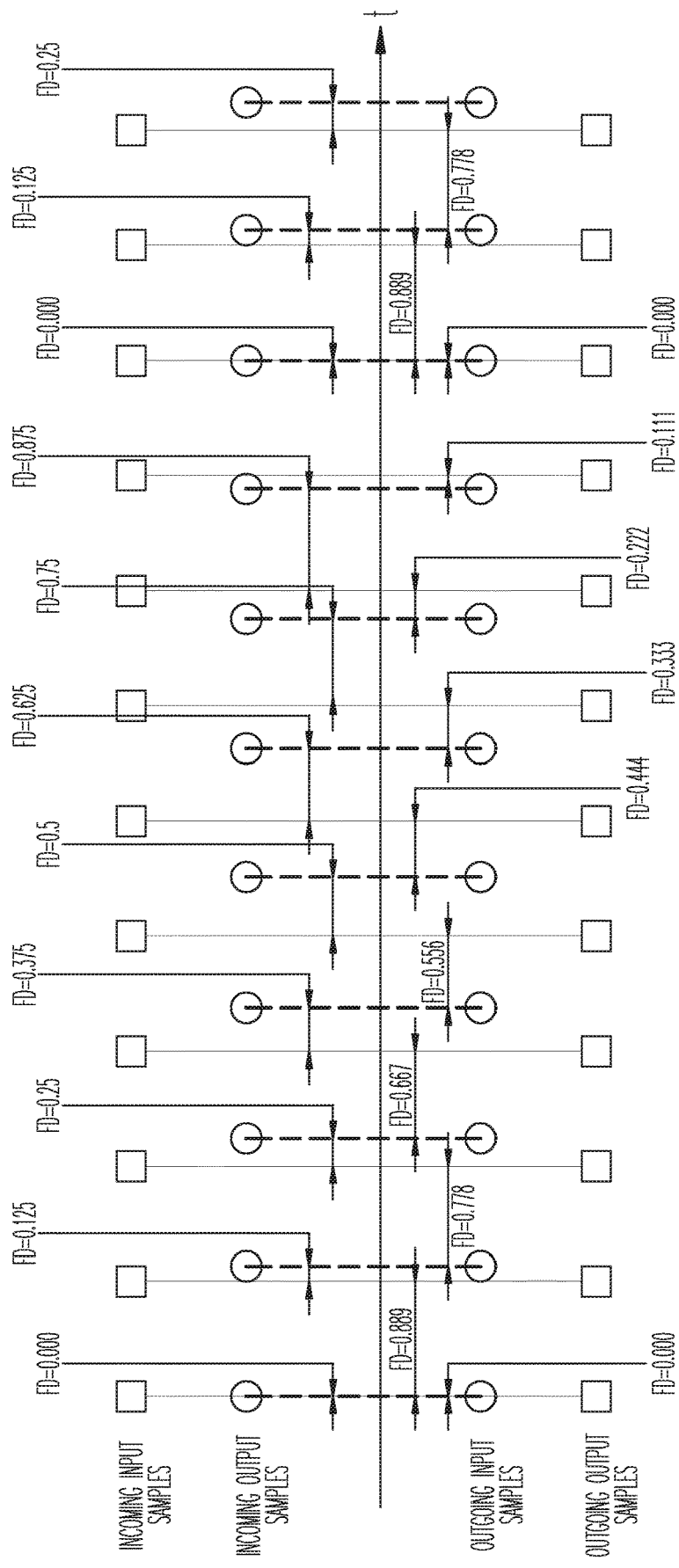
FIG. 10 illustrates a timing diagram of relative temporal position of samples of incoming and outgoing audio streams, according to various embodiments of the present subject matter.
Figure 11:
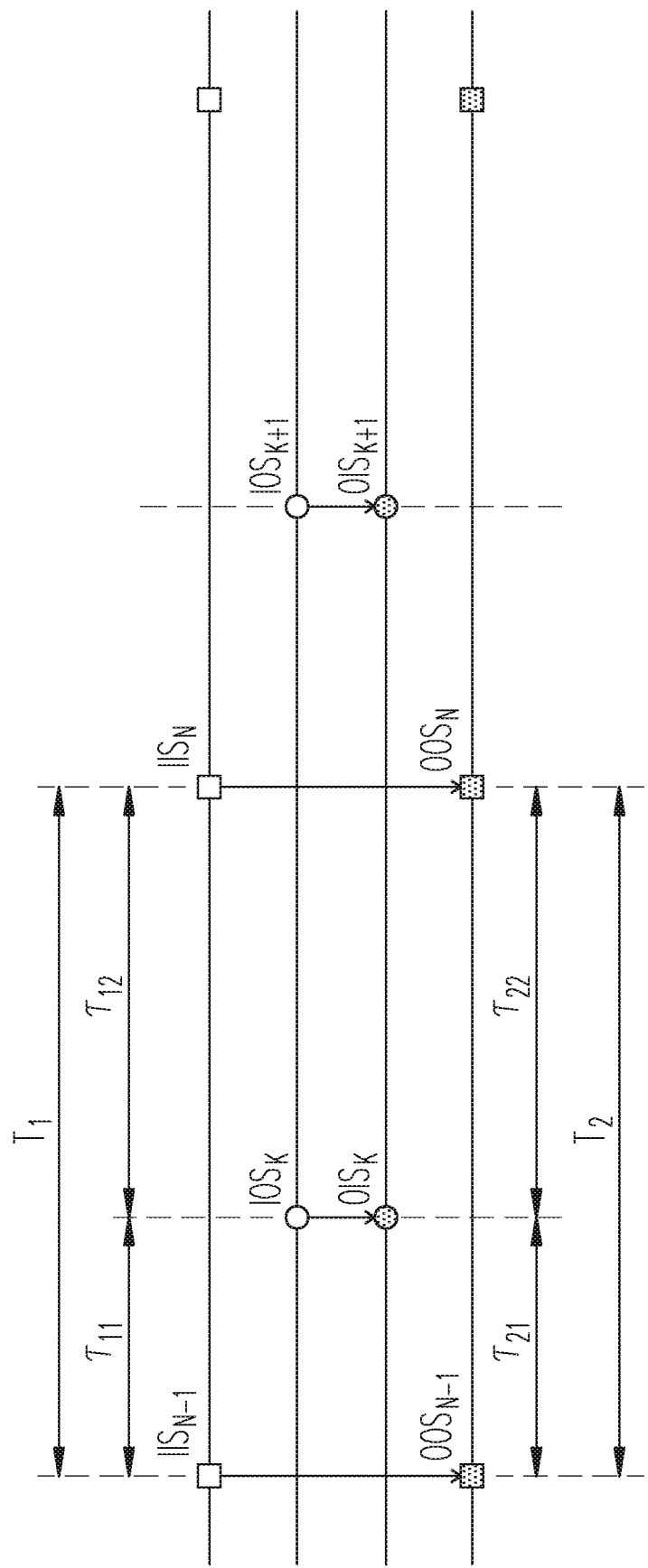
FIG. 11 illustrates a timing diagram for calculation of outgoing fractional delay, according to various embodiments of the present subject matter.

FIG. 10 illustrates a timing diagram of relative temporal position of samples of incoming and outgoing audio streams, according to various embodiments of the present subject matter. FIG. 11 illustrates a timing diagram for calculation of outgoing fractional delay; according to various embodiments of the present subject matter. Details of the geometrical relation between incoming and outgoing samples are shown in FIG. 11. Fractional delay for the incoming interpolator is calculated as:

$$FD_1 = \frac{\tau_{11}}{T_1}$$

Incoming fractional delay is calculated as an intermediate result by the incoming FD SRC as shown in FIG. 1.
To produce an outgoing sample by interpolator of the outgoing FD SRC "outgoing" fractional delay has to be calculated:

$$FD_2 = \frac{\tau_{21}}{T_2}$$

The following conversion expresses $FD_2$ through $FD_1$:

$$\tau_{21} = \tau_{12} = T_1 - \tau_{11}$$

$$FD_2 = \frac{\tau_{21}}{T_2} = \frac{T_1 - \tau_{11}}{T_2} = \frac{T_1}{T_2} \cdot \left(1 - \frac{\tau_{11}}{T_1}\right) = \frac{(1 - FD_1)}{\varphi_{inc1}}$$

Using the formula above, it is possible to calculate outgoing fractional ($FD_2$) delay through incoming fractional delay ($FD_1$) and current phase increment value of the incoming FD SRC ($\varphi_{inc1}$). In this way, one outgoing output sample can be calculated for each incoming input sample. This ensures equality of numbers of incoming input samples and outgoing output samples per packet, completely, eliminating possibility of outgoing buffer overflow or underflow.

Figure 12:
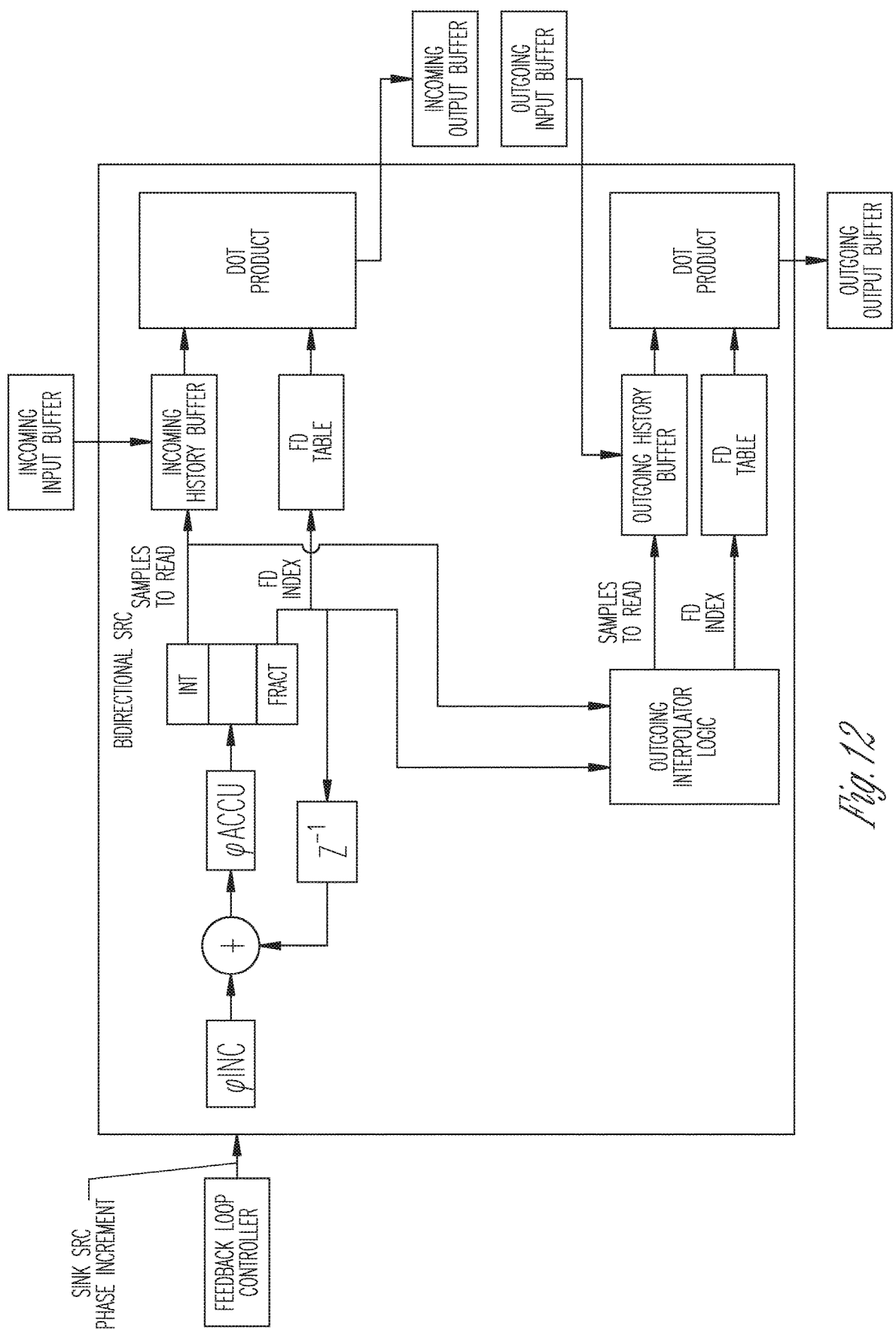
FIG. 12 illustrates a block diagram of an FD SRC with direct computation of outgoing interpolator parameters, according to various embodiments of the present subject matter.

As a result, instead of two unidirectional FD SRC modules, we end up with one bidirectional FD SRC. A block diagram of such a bidirectional FD SRC is shown in FIG. 12. FIG. 12 illustrates a block diagram of an FD SRC with direct computation of outgoing interpolator parameters, according to various embodiments of the present subject matter. Outgoing interpolator logic covers the scenario where zero or more than one sample was copied from the incoming input buffer to the history buffer of the incoming interpolator.

In the case where zero samples were copied, the outgoing interpolator reads one sample from the outgoing input buffer to the history buffer of the outgoing interpolator, but does not produce any output samples. In the case where more than one sample was copied, the outgoing interpolator reads one sample from the outgoing input buffer to the history buffer of the outgoing interpolator, and generates the same number of outgoing output samples using the following formula for calculation of the fractional delay of the $i^{th}$ sample:

$$FD_{2_i} = \frac{(i+1-FD_1)}{\varphi_{inc_1}}$$

Where
i—index of the outgoing output sample from 0 to (N−1)
N—number of samples copied from the incoming input buffer to the history buffer of the incoming interpolator to produce one output incoming sample
$FD_1$—fractional delay calculated by the NCO of bidirectional FD SRC
$\varphi_{inc_1}$—current phase increment of the bidirectional FD SRC Additional Embodiments The present subject matter can be applied for the case where sample rate of the outgoing audio stream is synchronized with external packet rate and interpolator parameters for the incoming audio sample are calculated from the interpolator parameters for the outgoing audio stream. The following formula can be used to calculate fractional delay of the incoming sample:

$$FD_{1_i} = \frac{(i+1-FD_2)}{\varphi_{inc_2}}$$

Advantages of the present subject matter include preventing underflow or overflow of the outgoing audio buffer in bidirectional TDD systems by locking the number of incoming and outgoing samples, improved quality of synchronization of incoming and outgoing sample rates that is better than provided by two independent FD SRC modules, and the present subject matter consumes less MIPS and memory than two independent FD SRC modules.

Various embodiments of the present subject matter support wireless communications with a hearing assistance device. In various embodiments the wireless communications can include standard or nonstandard communications. Some examples of standard wireless communications include link protocols including, but not limited to, Bluetooth™ IEEE 802.11 (wireless LANs), 802.15 (WPANs), 802.16 (WiMAX), cellular protocols including, but not limited to CDMA and GSM, ZigBee, and ultra-wideband (UWB) technologies. Such protocols support radio frequency communications and some support infrared communications. Although the present system is demonstrated as a radio system, it is possible that other forms of wireless communications can be used such as ultrasonic, optical, and others. It is understood that the standards which can be used include past and present standards. It is also contemplated that future versions of these standards and new future standards may be employed without departing from the scope of the present subject matter.

The wireless communications support a connection from other devices. Such connections include, but are not limited to, one or more mono or stereo connections or digital connections having link protocols including, but not limited to 802.3 (Ethernet), 802.4, 802.5, USB, ATM, Fibre-channel, Firewire or 1394, InfiniBand, or a native streaming interface. In various embodiments, such connections include all past and present link protocols. It is also contemplated that future versions of these protocols and new future standards may be employed without departing from the scope of the present subject matter.

It is understood that variations in communications protocols, antenna configurations, and combinations of components may be employed without departing from the scope of the present subject matter, Hearing assistance devices typically include an enclosure or housing, a microphone, hearing assistance device electronics including processing electronics, and a speaker or receiver. Processing electronics include a controller or processor, such as a digital signal processor (DSP), in various embodiments. Other types of processors may be used without departing from the scope of this disclosure. It is understood that in various embodiments the microphone is optional. It is understood that in various embodiments the receiver is optional. Antenna configurations may vary and may be included within an enclosure for the electronics or be external to an enclosure for the electronics. Thus, the examples set forth herein are intended to be demonstrative and not a limiting or exhaustive depiction of variations.

It is understood that the hearing aids referenced in this patent application include a processor. The processor may be a digital signal processor (DSP), microprocessor, microcontroller, other digital logic, or combinations thereof. The processing of signals referenced in this application can be performed using the processor. Processing may be done in the digital domain, the analog domain, or combinations thereof, Processing may be done using subband processing techniques. Processing may be done with frequency domain or time domain approaches. Some processing may involve both frequency and time domain aspects. For brevity, in some examples drawings may omit certain blocks that perform frequency synthesis, frequency analysis, analog-to-digital conversion, digital-to-analog conversion, amplification, and certain types of filtering and processing. In various embodiments the processor is adapted to perform instructions stored in memory which may or may not be explicitly shown. Various types of memory may be used, including volatile and nonvolatile forms of memory. In various embodiments, instructions are performed by the processor to perform a number of signal processing tasks. In such embodiments, analog components are in communication with the processor to perform signal tasks, such as microphone reception, or receiver sound embodiments (i.e., in applications where such transducers are used). In various embodiments, different realizations of the block diagrams, circuits, and processes set forth herein may occur without departing from the scope of the present subject matter.

The present subject matter can be used for a variety of hearing assistance devices, including but not limited to, cochlear implant type hearing devices, hearing aids, such as behind-the-ear (BTE), in-the-ear (ITE), in-the-canal (ITC), invisible-in-the-canal (IIC) or completely-in-the-canal (CIC) type hearing aids. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the user. Such devices are also known as receiver-in-the-canal (RIC) or receiver-in-the-ear (RITE) hearing instruments. It is understood that other hearing assistance devices not expressly stated herein may fall within the scope of the present subject matter. Further, the present subject matter can be used for persons without hearing impairment that may be using wireless, or wired headphone and earbud devices for listening to audio streams.

This application is intended to cover adaptations or variations of the present subject matter. It is to be understood that the above description is intended to be illustrative, and not restrictive. The scope of the present subject matter should be determined with reference to the appended claims, along with the full scope of legal equivalents to which such claims are entitled.

What is claimed is:

1. A method for wireless communications, comprising:
receiving a transmission of a packet using a wireless transceiver of an electronic device;
using a processor of the electronic device to read a first value of a system timer and storing the first value as an arrival time stamp;
decoding and processing the packet using the processor;
sending the processed packet to an output of the electronic device;
when the processed packet is sent, reading a second value of the system timer;
calculating a departure time stamp by adding the second value to a fractional delay of a sample rate converter of the electronic device;
calculating a throughput delay for the electronic device;
calculating an error signal as a difference between the calculated throughput delay and a constant preconfigured delay; and
using the error signal to calculate an adjustment stimulus for the sample rate converter to maintain the calculated throughput delay equal to the preconfigured delay.

2. The method of claim 1, further comprising maintaining the calculated throughput delay scaled to a timescale of a transmitting device equal to the preconfigured delay.

3. The method of claim 1, wherein the sample rate converter is a fractional delay sampling rate converter (FD SRC).

4. The method of claim 3, comprising calculating two phase increment values for sink and source FD SRC instances.

5. The method of claim 1, wherein calculating the throughput delay for the electronic device includes calculating a difference between the departure time stamp and the arrival time stamp.

6. The method of claim 1, comprising tracking processing time and automatically reconfiguring a value of the preconfigured delay in order to minimize total system throughput delay.

7. The method of claim 1, wherein using a wireless transceiver of an electronic device includes using a wireless transceiver of a hearing device.

8. The method of claim 7, wherein the hearing device includes a hearing assistance device.

9. The method of claim 8, wherein the hearing assistance device includes a hearing aid.

10. The method of claim 8, wherein the hearing assistance device includes a cochlear implant.

11. A device for wireless communications, comprising:
a wireless transceiver configured to receive a transmission of a packet; and
one or more processors programmed to:
read a first value of a system timer and storing the first value as an arrival time-stamp;
decode and process the packet;
send the processed packet to an output of the device;
when the processed packet is sent, read a second value of the system timer;
calculate a departure time stamp by adding the second value to a fractional delay of a sample rate converter of the device;
calculate a throughput delay for the device;
calculate an error signal as a difference between the calculated throughput delay and a constant preconfigured delay; and
use the error signal to calculate an adjustment stimulus for the sample rate converter to maintain the calculated throughput delay equal to the preconfigured delay.

12. The device of claim 11, wherein the sample rate converter is a fractional delay sampling rate converter (FD SRC).

13. The device of claim 12, wherein the one or more processors are further programmed to calculate two phase increment values for sink and source FD SRC instances.

14. The device of claim 11, wherein the one or more processors are further programmed to maintain the calculated throughput delay scaled to a timescale of a transmitting device equal to the preconfigured delay.

15. The device of claim 14, wherein the one or more processors are further configured to calculate the throughput delay for the device by calculating a difference between the departure time stamp and the arrival time stamp.

16. The device of claim 11, wherein the one or more processors are further configured to track processing time and automatically reconfigure a value of the preconfigured delay in order to minimize total system throughput delay.

17. The device of claim 11, wherein the device is a hearing device.

18. The device of claim 17, wherein the hearing device includes a hearing assistance device.

19. The device of claim 18, wherein the hearing assistance device includes a hearing aid.

20. The device of claim 18, wherein the hearing assistance device includes a cochlear implant.

* * * * *